United States Patent [19]

Tam

[11] Patent Number: 4,814,286

[45] Date of Patent: Mar. 21, 1989

[54] EEPROM CELL WITH INTEGRAL SELECT TRANSISTOR

[75] Inventor: Simon M. Tam, San Mateo, Calif.

[73] Assignee: Intel Corporation, Santa Clara, Calif.

[21] Appl. No.: 192,296

[22] Filed: May 9, 1988

Related U.S. Application Data

[62] Division of Ser. No. 9,998, Feb. 2, 1987.

[51] Int. Cl.$^4$ .................... H01L 29/94; H01L 29/78
[52] U.S. Cl. ........................ 437/27; 437/30; 437/43; 437/44
[58] Field of Search ............ 437/27, 28, 29, 30, 437/43, 44, 52; 357/23.5

[56] References Cited

U.S. PATENT DOCUMENTS

| | | | |
|---|---|---|---|
| 4,114,255 | 9/1978 | Sodbery | 357/23.5 |
| 4,203,158 | 5/1980 | Mar et al. | 357/23.5 |
| 4,258,378 | 3/1981 | Wall | 357/23.5 |
| 4,266,283 | 5/1981 | Perlegos et al. | 365/185 |
| 4,328,565 | 5/1982 | Harari | 357/23.5 |
| 4,364,075 | 12/1982 | Bohr et al. | 357/41 |
| 4,412,311 | 10/1983 | Miccoli et al. | 365/185 |
| 4,566,175 | 1/1986 | Smayling et al. | 357/91 |
| 4,590,503 | 5/1986 | Harari et al. | 365/185 |
| 4,622,656 | 11/1986 | Kamiya et al. | 357/23.5 |
| 4,646,425 | 3/1987 | Owens et al. | 437/43 |
| 4,757,026 | 7/1988 | Woo et al. | 437/29 |

FOREIGN PATENT DOCUMENTS 0245270 12/1985 Japan ........................ 437/43
2077492 12/1981 United Kingdom .

Primary Examiner—Olik Chaudhuri
Attorney, Agent, or Firm—Blakely, Sokoloff, Taylor & Zafman

[57] ABSTRACT

An electrically programmable and electrically erasable floating gate memory device which includes an integrally formed select device. In the n-channel embodiment, a boron region is formed adjacent to the drain region under the control gate and extends slightly under the folating gate. This region is formed using a spacer defined with an anisotropic etching step. The region, in addition to providing enhanced programming, prevents conduction when over-erasing has occurred, that is, when the erasing causes the cell to be depletion-like.

6 Claims, 2 Drawing Sheets

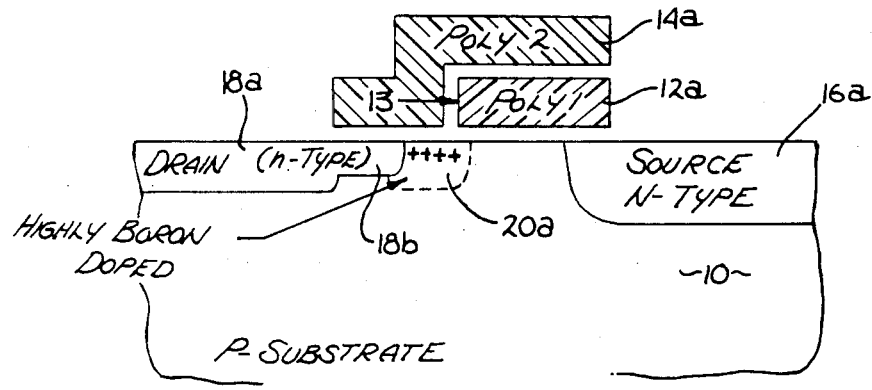
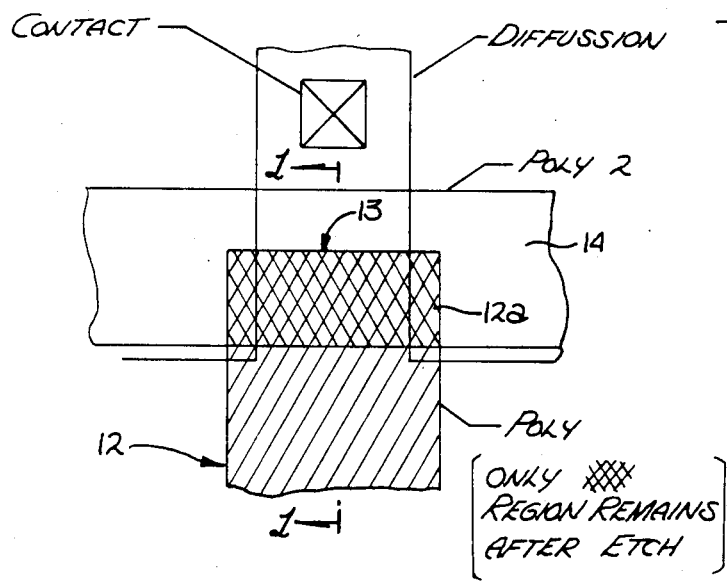
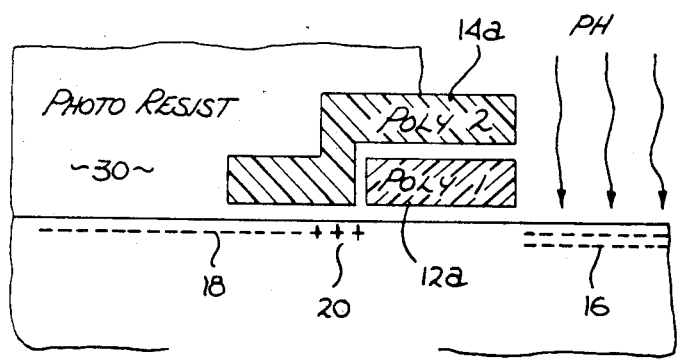
Fig. 1
Fig. 2
Fig. 9

EEPROM CELL WITH INTEGRAL SELECT TRANSISTOR

This is a divisional of application Ser. No. 009,998, filed Feb. 2, 1987.

BACKGROUND OF THE INVENTION

1. Field of the Invention

The invention relates to the field of electrically programmable and electrically erasable memory cells particularly those employing floating gates.

2. Prior Art

For many years now, metal-oxide-semiconductor (MOS) technology has been used to fabricate electrically programmable read-only memories (EPROMs). Many of these cells employ floating gates, that is, generally polysilicon members completely surrounded by an insulator. Electrical charge is transferred into the floating gate through a variety of mechanisms such as avalanche injection, channel injection, Fowler-Nordheim tunnelling, hot electron injection from the substrate, etc. A variety of phenomena have been used to remove charge including exposing the memory to ultraviolet radiation. Commercial EPROMs with floating gates first used avalanche injection to charge the floating gate; in second generation memories channel injection is used for programming. These memories are currently erased by exposure to ultraviolet radiation.

Commercial electrically programmable and electrically erasable memories (EEPROMs) have generally used a thin oxide region to tunnel charge into and from a floating gate. In a typical memory, a two transistor cell is used. See, for instance, U.S. Pat. No. 4,203,158 for a discussion of such cells and U.S. Pat. No. 4,266,283 for a discussion of related circuitry. These EEPROM cells do not lend themselves to being reduced in substrate area as do the EPROM cells. Thus, while relatively dense EPROMs are currently available (e.g., 256K) the EEPROMs are not available in as dense arrays.

Ideally, an EEPROM cell is needed which lends itself to small scale geometries (below the 50 micro m² densities which is projected to be the best achievable for current cells). Importantly, the EEPROM should operate from a 5 volt potential; that is, the current needed for high voltage programming and erasing should be provided by a charge pumping circuit located on the chips.

One attempt to provide higher density, low voltage EPROM and EEPROM cells is shown in U.S. Pat. No. 4,432,075 and U.S. Pat. No. 4,577,295. A single source of hot electrons is shared by a number of cells for programming. This provides the advantages of not requiring the larger geometries used to assure channel injection. This technology has not yet been commercialized since programming appears to be slow.

A single transistor EEPROM cell which uses channel injection for programming a floating gate and tunneling for discharging the gate is described in copending application, Ser. No. 892,446, filed Aug. 4, 1986, and entitled LOW VOLTAGE EEPROM CELL. This application is assigned to the assignee of the present application. The advantages of this cell are its small size, its ability to be reduced in scale and the fact that it is a true "one-transistor" electrically programmable and electrically erasable cell. Moreover, this cell is compatible with conventional UV-erasable EPROM processing.

There are, however, some potential problems with the memory cell mentioned in the preceding paragraph. First, the threshold of the cell may become negative (i.e., depletion like) after erasing. The negative threshold voltage after erasing can disable an entire column line in an array. Secondly, the limited gate diode breakdown voltage at the source region (the node where erase voltage is applied) can be troublesome. The limited gated diode breakdown voltage may lead to potential reliability problems, as well as difficulty in providing an adequate charge pump circuit.

As will be seen the present invention provides a memory cell which overcomes the problems, yet is realizable in a high density array.

Other prior art known to Applicant is an article entitled "EPROM Cell with High Gate Injection Efficiency", presented at the International Electron Device Meeting, San Francisco, Calif. December, 1982 by N. Kamiya. Also, U.S. Pat. No. 4,114,255 describes the use of p-type regions formed as part of "front-end" processing which cause charge to be more easily injected from the channel into a floating gate device.

SUMMARY OF THE INVENTION

An electrically programmable and electrically erasable memory cell formed in a silicon body is described. The cell includes a first and second spaced-apart regions of a first conductivity type which define a channel. A first gate member (floating gate) which is completely surrounded with insulation, extends from at least the edge of the first of the regions to over the channel. A second gate member (control gate) includes a portion which extends over the first gate member, the second gate generally extends from at least the edge of the first region, over the channel, and to at least the edge of the second region. A third region of a second conductivity type is formed in the body. This third region is contiguous with the edge of the second region and extends to at least the edge of the first gate member. The cell thus includes both a memory device and an integrally formed select device.

BRIEF DESCRIPTION OF THE DRAWINGS

FIG. 1 is a cross-sectional elevation view showing a currently preferred embodiment of the invented memory cell.

FIG. 2 is a plan view of the memory cell of FIG. 1.

FIG. 9 illustrates the substrate of FIG. 8 after the formation of a photoresist layer which covers a portion of the substrate and during an additional doping step.

DETAILED DESCRIPTION OF THE PRESENT INVENTION

Figure 3:
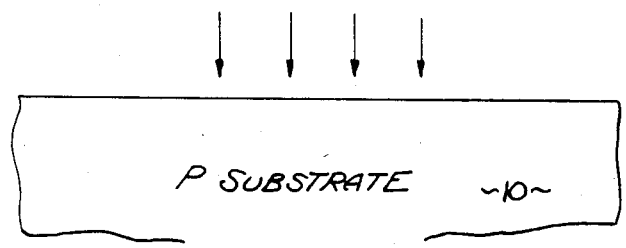
FIG. 3 is a cross-sectional elevation view of a substrate upon which the memory cell of FIG. 1 is fabricated.

A memory cell and process for forming the memory cell is described. The invented memory cell is an electrically programmable and electrically erasable metal-oxide-semiconductor device which includes an integrally formed select transistor. In the following description, numerous specific details are set forth such as specific doping levels, etc., in order to provide a thorough understanding of the present invention. However, it will be obvious to one skilled in the art that the present invention may be practiced without these specific details. In other instances, well-known structures and steps are not described in detail in order not to unnecessarily obscure the present invention.

In the following description, the invented memory cell is described formed on a p-type silicon substrate using NMOS technology. It will be obvious to one skilled in the art the the described memory cell may be formed in a well such as is often done in CMOS processing, or in a layer such as an epitaxial layer, or in other semiconductor bodies.

Referring to FIG. 1, a completed memory cell is shown fabricated on a p-type monocrystalline silicon substrate 10. It includes an n-type source region 16a which is spaced-apart from an n-type drain region 18a/18b. A channel region is defined between the source and drain region. The source region 16a extends deeper into the substrate than does the main region 18a of the drain region. The drain region also includes a portion 18b which is shallower than the main drain region 18a. A third region 20a is also formed in the substrate contiguous to the drain region and more particularly contiguous with the portion 18b of the drain region. Region 20a is formed with the p-type dopant boron.

A first polysilicon layer is used to form the polysilicon gate 12a. This gate is insulated from the substrate 10 by a gate silicon dioxide layer and is completely surrounded by silicon dioxide. This gate is a "floating gate" as is used with many prior art EPROM and EEPROM cells. The floating gate 12a extends from at least the edge of the source region 16a to the edge of the region 20a. In fact, because of lateral diffusion which occurs during the processing, the source region 16a, as well as the third region 20a, extend beneath the edges of the floating gate 12a.

The memory cell includes a control gate formed from a second layer of polysilicon. The control gate 14a is insulated from the floating gate 12a and from the substrate. The floating gate extends over the floating gate 12a and continues beyond the edge 13 of floating gate 12a and overlaps the drain region 18a/18b.

In the plan view of FIG. 2, a polysilicon strip 12 is shown. A portion of this strip is etched in alignment with the overlying polysilicon strip 14 to define the edge of the floating gate 12a opposite the edge 13. (Strip 14 forms a program/erase/read line in an array containing the invented cells. The strip 14 includes a plurality of gates 14a in the array.) A contact (metal contact) is shown extending into the drain region to allow contact with this region.

To program the device of FIG. 1, that is, to place electrons on the floating gate 12a, a high voltage is applied to the control gate 14a (e.g., 10–14 volts) while the drain terminal is brought high (e.g., 5–8 volts). The source is grounded. For these conditions, a channel injection occurs and electrons are transferred onto the floating gate 12a. To erase the floating gate (remove charge), the control gate 14a is held at ground and a high voltage is applied to the source region (e.g., 11–14 volts) while the drain region is floating. For these conditions, charge is transferred to the source region. The state of the floating gate is determined (during read cycles) by applying a reference potential to the control gate 14a and then determining whether or not conduction occurs between the source and drain regions as is customarily done. It may also be possible in some applications to use "reverse erasing". Here the source and drain are reversed from that shown in the drawings with both programming and erasing being performed from the drain region.

The region 20a acts as a select transistor (select transistors are often used, see for example, U.S. Pat. No. 4,266,283). When the reference potential is not applied to the gate 14a (e.g., when the gate is grounded), the integrally formed select transistor defined by region 20a will be off. Thus, even if the floating gate 12a is repeatedly erased, becoming and acting like a depletion mode device no current will flow. In this way, the column in the memory array containing the cell will not be affected. This is an important advantage over the memory cell discussed in the prior art section which does not employ a select transistor.

Referring to FIG. 3, in the presently preferred embodiment, the fabrication of the invented memory cell begins with a p-type, monocrystalline silicon substrate 10. The substrate is implanted with boron to adjust the ultimate threshold voltage of the memory cell. By way of example, to provide the presently preferred enhancement mode device, boron is implanted to a level of $1 \times 10^{11}/cm^2$ in one or more implantation steps.

Figure 4:
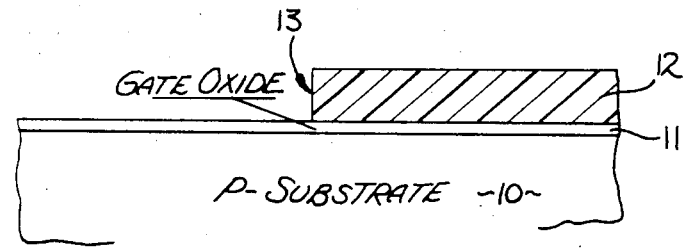
FIG. 4 illustrates the substrate of FIG. 3 after the formation of a gate oxide layer and the partial formation of a first polysilicon gate member.

Following this, as shown in FIG. 4, an insulative layer is formed on the substrate 10. This layer is preferably thermally grown silicon dioxide and may be in the range of 150 Å thick or less. The implantation of the threshold voltage adjusting dopant of FIG. 1 may occur through the gate oxide layer (as is sometimes done).

A first layer of polycrystalline silicon (polysilicon) is formed over the gate oxide layer 11. In the presently preferred embodiment, one edge 13 of a floating gate is defined as shown in FIG. 4. (Also the sides of the gate are defined as shown in FIG. 2 to form the strip 12.) The edge of the floating gate opposite edge 13 may also be defined at this time, however, as previously mentioned, in the currently preferred embodiment, this second edge is defined in alignment with the subsequently formed control gate 14a. Ordinary photolithographic processing and etching are used to etch this first polysilicon layer.

Figure 5:
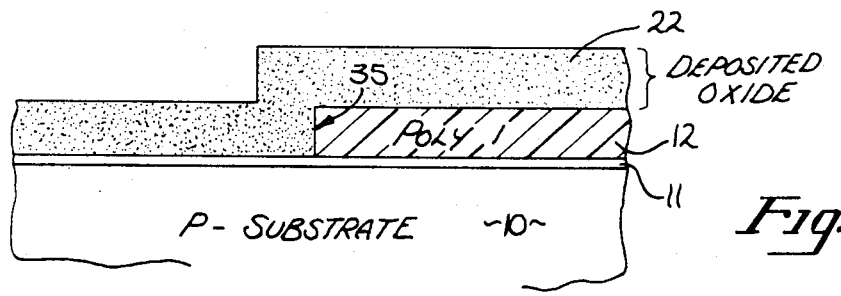
FIG. 5 illustrates the substrate of FIG. 4 after the formation of a silicon dioxide layer over the first polysilicon gate member.

Next, as shown in FIG. 5, a chemical vapor deposited silicon dioxide layer 22 is formed over the surface of the structure shown in FIG. 4. This layer may be 5000 to 10,000 Å thick.

Figure 6:
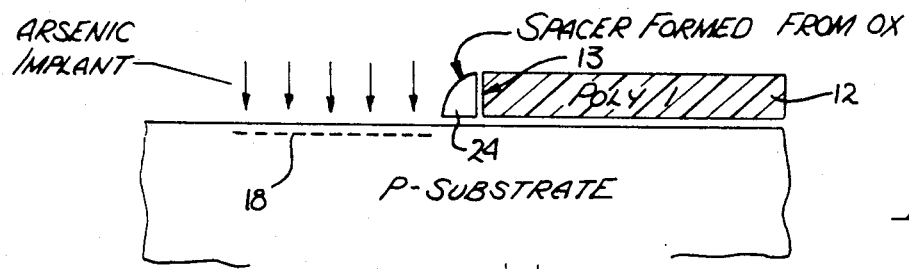
FIG. 6 illustrates the substrate of FIG. 5 after an etching step which is used to form a spacer and during a first ion implantation step.

The layer 22 is now subjected to an anisotropic plasma etching step. This step is controlled in a manner well-known to partially etch away the layer 22. The region of the layer 22 adjacent the edge 35 is thicker as shown best in FIG. 5 and the etching can be controlled to cause the oxide layer 22 to remain at this thicker region. This thicker region is shown as spacer 24 in FIG. 6.

With spacer 24 in place, the substrate is subjected to an n-type dopant implant (arsenic is used in the currently preferred embodiment) to a level of $1.0 \times 10^{15}/cm^2$. Note that the spacer 24 is thick enough to prevent implantation of the dopant beneath spacer 24.

Figure 7:
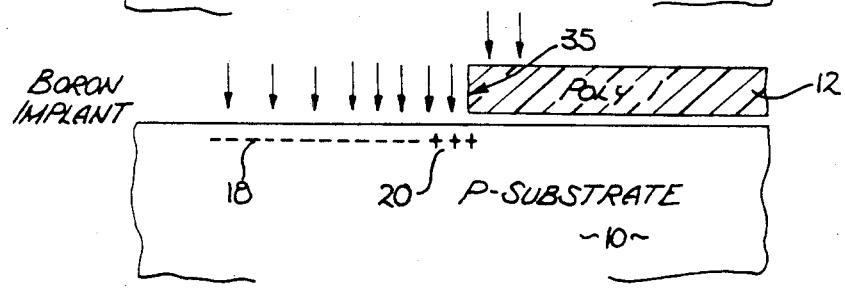
FIG. 7 illustrates the substrate of FIG. 6 after the spacer has been removed and during a second implantation step.

Now the spacer 24 is removed with an ordinary etching step and boron is implanted as shown in FIG. 7 to a level of $1 \times 10^{13}/cm^2$. This dopant is aligned with edge 35 of gate 12a forming region 20. Note that the boron dopant is also deposited into region 18, however, this region remains an n-type region since the level of the boron doping used is not sufficient to change the conductivity type of this region.

An interpolysilicon dielectric layer is now formed over the structure shown in FIG. 7. For example, a CVD silicon dioxide layer is formed and then a second layer of polysilicon is deposited on this silicon dioxide layer. The second layer of polysilicon is etched to form the control gate shown as control gate 14a in FIG. 8. Ordinary photolithographic and etching steps are used for this purpose. As previously mentioned, the edge of the floating gate 12a opposite edge 35 is now formed in alignment with the overlying control gate 14a. An etching process for forming this alignment between the first and second layers of polysilicon is described in U.S. Pat. No. 4,142,926.

Figure 8:
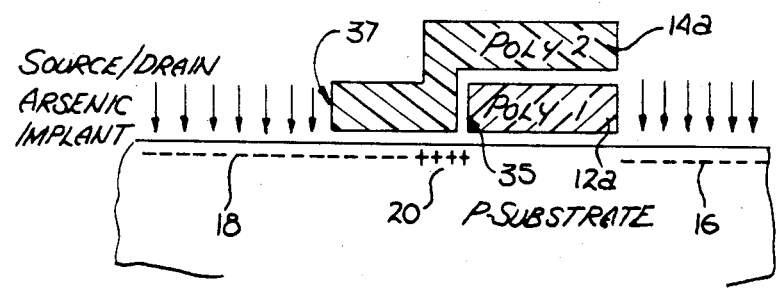
FIG. 8 illustrates the substrate of FIG. 7 after a second polysilicon gate has been formed and during a third ion implantation step.

Now, as also shown in FIG. 8, the substrate is subjected to an arsenic implantation; a conventional source/drain implantation to a level of $4 \times 10^{15}/cm^2$ is used. This implantation occurs generally in alignment with the control gate 14a. The dopant for the source region is thus implanted into the substrate (region 16) while the dopant for the drain region beyond the edge of the control gate 14a is implanted in the substrate (region 18). Note that there is more arsenic dopant beyond the edge 37 of the gate 14 than under the gate 14a adjacent to the edge 35 since the region beyond the edge has twice been implanted with arsenic.

As illustrated in FIG. 9, an ordinary masking step is next used to define a photoresist masking member 30 which covers the region 18 while leaving the region 16 exposed. Another implantation step is used to further dope region 16, this time with a phosphorus dopant. In the currently preferred embodiment, phosphorus is implanted to a level between $5 \times 10^{14}/cm^2$ to $1 \times 10^{15}/cm^2$. Phosphorus dopant is selected since it diffuses more readily into the silicon than does arsenic, thereby providing a more graded source junction profile, that is, the rate at which the n-type dopant changes at the junction is more gradual when compared to the drain region.

The substrate in subsequent processing is subjected to a high temperature driver step to activate the dopants. This results in the source region 16a and the shallower drain region 18a/18b. The drain region comprises a main drain region 18a which is deeper than the portion 18b of the drain region. The driver step drives the source region slightly under the edges of both the floating gate and control gate and drives the region 20a slightly under the edge 13 of the floating gate. The deeper portion of the drain region 18a is driven under the edge of the control gate.

Ordinary "rear-end" steps are now used to complete the device including the formation of a passivation layer and metallization.

The above-described process results in the formation of a "spacer defined" channel region of less than 0.5 microns at the drain side of the memory cell. The relatively high boron implant used in this region causes the boron to out diffuse and overlap a small part of the floating gate channel, that is region 20a extends under the edge 13 of the floating gate 12a as mentioned. This high boron concentration in this region results in high channel electric field and hence, provides good programming characteristics. It is important to note that the width of the spacer defined boron region remains fairly constant, that is to say, it is substantially independent of typical process variations. This is a result of the well behaved nature of the anisotropic plasma etching used to form the spacer 24 of FIG. 6. The gap between the sidewall of the floating gate and the overlying control gate (separated by an interpoly dielectric) also enhances the programming characteristics as discussed in the article by N. Kamiya cited in the prior art section of this application, although this is more important for the reverse erasing mode discussed above.

It should be noted that the doping concentration under the floating gate on the source side of the device is relatively light, therefore the source gate diode breakdown voltage is not degraded. This higher source gate diode breakdown voltage allows the use of a higher erase voltage, and hence, permits a shorter erase time and/or thicker gate oxide.

Thus, an electrically programmable and electrically erasable memory cell has been described. The cell includes a "spacer defined" channel region integrated with the floating gate device forming an integral select device. This spacer defined region also provides enhanced programming. The region permits the memory cell to be erased to "depletion" without affecting the performance of the memory cell.

I claim:

1. A process for forming an electrically programmable and electrically erasable memory cell in a silicon body comprising the steps of:
    forming a first insulative layer on said body;
    defining at least a first edge of a first polysilicon gate member from a first polysilicon layer formed on said first insulative layer;
    depositing a second insulative layer so as to cover said exposed portions of said first insulative layer and said first gate member;
    etching said second insulative layer so as to define a spacer member adjacent to said first edge of said first gate member;
    doping said silicon body with a first doping step with a dopant of a first conductivity type, said spacer member protecting a first region in said body under said spacer member from receiving said dopant;
    removing said spacer member;
    doping main body with a second doping step with a dopant of a second conductivity type so as to dope said first region with said dopant of said second conductivity type;
    forming a second polysilicon layer over said first gate member and insulated therefrom and defining a second gate member from said second layer, said second layer member extending over said first region;
    forming source and drain regions in said body with a third doping step in alignment with said second gate member;
    whereby a memory cell having an integrally formed select device is realized.

2. The process defined by claim 1 including the additional steps of covering said drain region and additionally doping said source region so as to form a deeper source region when compared to the depth of said drain region.

3. The process defined by claim 1 or claim 2 wherein said first conductivity type dopant is an n-type dopant and said second conductivity type dopant is a p-type dopant.

4. The process defined by claim 2 when said first doping step comprises the implantation of arsenic.

5. The process defined by claim 3 wherein said second dopant step comprises the implantation of boron.

6. The process defined by claim 1 or 2 wherein the second edge of said first gate member and an edge of said second gate member are formed in alignment with one another.

* * * * *

UNITED STATES PATENT AND TRADEMARK OFFICE
CERTIFICATE OF CORRECTION

PATENT NO. : 4,814,286
DATED : 03/21/89
INVENTOR(S) : Tam

It is certified that error in the above-identified patent and that said Letters Patent is hereby corrected as shown below:

| | | |
|---|---|---|
| col. 02, line 06 | delete "gate" | insert --gated-- |
| col. 06, line 52 | delete "main" | insert --said-- |
| col. 06, line 59 | delete "layer" | insert --gate-- |
| Abstract [57], line 06 | delete "folating" | insert --floating-- |

Signed and Sealed this

Eleventh Day of December, 1990

Attest:

HARRY F. MANBECK, JR.

*Attesting Officer*     *Commissioner of Patents and Trademarks*